US007900355B2

(12) United States Patent
Hirota

(10) Patent No.: US 7,900,355 B2
(45) Date of Patent: Mar. 8, 2011

(54) INK-JET HEAD AND METHOD FOR MANUFACTURING THE SAME

(75) Inventor: Atsushi Hirota, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 180 days.

(21) Appl. No.: 11/523,593

(22) Filed: Sep. 20, 2006

(65) Prior Publication Data

US 2007/0013749 A1 Jan. 18, 2007

Related U.S. Application Data

(62) Division of application No. 10/796,140, filed on Mar. 10, 2004, now Pat. No. 7,237,876.

(30) Foreign Application Priority Data

Mar. 19, 2003 (JP) ................................ 2003-074996

(51) Int. Cl.
*B23P 17/00* (2006.01)
*H01L 41/22* (2006.01)
*H04R 17/00* (2006.01)
*B41J 2/135* (2006.01)

(52) U.S. Cl. ............ 29/890.1; 29/25.35; 347/44; 347/45

(58) Field of Classification Search ................. 29/25.35, 29/890.1; 347/44, 45
See application file for complete search history.

(56) References Cited

U.S. PATENT DOCUMENTS

| | | | | |
|---|---|---|---|---|
| 5,087,930 | A | 2/1992 | Roy et al. | |
| 5,406,318 | A | 4/1995 | Moore et al. | |
| 6,024,439 | A | 2/2000 | Sueoka et al. | |
| 6,523,943 | B1 | 2/2003 | Fukui | |
| 6,695,437 | B2 | 2/2004 | Nakamura et al. | |
| 6,969,158 | B2 * | 11/2005 | Taira | 347/70 |
| 7,128,405 | B2 * | 10/2006 | Suzuki | 347/72 |
| 2001/0040594 | A1 * | 11/2001 | Sleger et al. | 347/5 |
| 2001/0050696 | A1 * | 12/2001 | Suzuki et al. | 347/27 |
| 2002/0123158 | A1 | 9/2002 | Murai | |
| 2002/0196315 | A1 * | 12/2002 | Isono et al. | 347/71 |
| 2003/0025768 | A1 * | 2/2003 | Koike et al. | 347/68 |
| 2003/0156166 | A1 * | 8/2003 | Sakaida | 347/68 |

FOREIGN PATENT DOCUMENTS

CN 1394747 A 2/2003

(Continued)

OTHER PUBLICATIONS

Mar. 31, 2006 Office Action for Chinese Patent Application No. 200410030115.1 (with English translation).

*Primary Examiner* — A. Dexter Tugbang
*Assistant Examiner* — David P Angwin
(74) *Attorney, Agent, or Firm* — Oliff & Berridge, PLC

(57) ABSTRACT

A head main body includes a passage unit having nozzles and pressure chambers, and an actuator unit adhered to the passage unit to change the volume of the pressure chambers. On a piezoelectric sheet of the actuator unit, formed are not only individual electrodes corresponding to the respective pressure chambers, but also a land and a dummy land in a pair corresponding to each of the individual electrodes. The land is connected to the individual electrode, and the dummy land is spaced from the individual electrode. The land and the dummy land have substantially the same height from a surface of the piezoelectric sheet, which is higher than that of the individual electrodes. The individual electrodes are connected, through the land, to a cable member to supply a drive signal to the actuator unit.

5 Claims, 15 Drawing Sheets

FOREIGN PATENT DOCUMENTS

| | | |
|---|---|---|
| JP | A-03-150165 | 6/1991 |
| JP | A-07-156376 | 6/1995 |
| JP | B2-07-67803 | 7/1995 |
| JP | A-09-141874 | 6/1997 |
| JP | A-11-34323 | 2/1999 |
| JP | B2-2987944 | 10/1999 |
| JP | B2-3319413 | 6/2002 |
| JP | A-2003-39673 | 2/2003 |

* cited by examiner

INK-JET HEAD AND METHOD FOR MANUFACTURING THE SAME

This is a Division of application Ser. No. 10/796,140 filed Mar. 10, 2004. The entire disclosure of the prior application is hereby incorporated by reference herein in its entirety.

BACKGROUND OF THE INVENTION

1. Field of the Invention

The present invention relates to an ink-jet head that ejects ink onto a recording medium to conduct recordings, and also to a method for manufacturing the ink-jet head.

2. Description of Related Art

An ink-jet head used in an ink-jet recording apparatus such as ink-jet printers has a passage unit provided with many pressure chambers and many nozzles communicating with the pressure chambers. Ink is distributed from an ink tank to the pressure chambers, and pressure is selectively applied to each pressure chamber, so that the volume of each pressure chamber is changed and ink is ejected through a corresponding nozzle. In order to apply pressure to the respective pressure chambers, an actuator is disposed on a face of the passage unit that has the pressure chambers formed thereon.

In general, the passage unit and the actuator are adhered to each other through the steps of: forming an adhesive layer on wall portions defining the pressure chambers in the passage unit; positioning the actuator onto the passage unit; disposing a pressurizing member such as a heater on the actuator; and then performing pressure application and heating. When a thickness of the adhesive layer between the passage unit and the actuator is nonuniform, there may arise a problem that the pressure chambers vary from each other in pressure generated therein and therefore the nozzles exhibit different ink ejection characteristics from each other to result in deterioration in image quality. In an extreme case, an ink leakage between the pressure chambers can be caused. Accordingly, for a prevention of a variation in ink ejection characteristics, it has been desired that the adhesive layer has a uniform thickness.

A piezoelectric element is typically adopted as the actuator. In this case, an electrode as a surface electrode is formed on the piezoelectric element and a drive signal is outputted to the surface electrode, to thereby deform the piezoelectric element and accordingly change the volume of the pressure chamber. In this technique, sometimes, a surface electrode is formed individually for each pressure chamber, and each surface electrode includes a main body having a slightly smaller area than a pressure chamber area and an extension extending to an outside of the pressure chamber area, i.e., extending to a position opposing a wall portion that defines the pressure chamber (see Japanese Patent Laid-Open No. 11-34323). In this construction, a contact between the surface electrode and another member such as a flexible flat cable is formed on the extension of the surface electrode. An electrical connection between the surface electrode and the cable is achieved by soldering the cable to the contact or pressing against the contact a contact member such as a terminal.

In the above-described construction, however, the contact with the cable is formed on the extension of the surface electrode. Consequently, when the cable is disposed on the piezoelectric element, there is formed only a relatively narrow space between the cable and the piezoelectric element. When, under such a condition, the cable is soldered onto the extension of each surface electrode, overflow of a solder tends to cause a short circuit between neighboring surface electrodes. This problem becomes prominent particularly when the pressure chambers are densely arranged in the passage unit.

SUMMARY OF THE INVENTION

An object of the present invention is to provide an ink-jet head and a method for manufacturing the ink-jet head having a structure in which a piezoelectric element acting as an actuator is disposed on a passage unit having pressure chambers formed therein, wherein an adhesive layer formed between the passage unit and the piezoelectric element has a uniform thickness, and wherein surface electrodes formed on the piezoelectric element can be connected to a cable member with high reliability.

According to an aspect of the present invention, there is provided an ink-jet head comprising a passage unit that has a plurality of pressure chambers and a plurality of nozzles communicating with the respective pressure chambers, an actuator unit that is adhered to the passage unit and changes the volume of the pressure chambers to thereby eject ink through the nozzles, and a cable member that supplies a drive signal to the actuator unit. The actuator unit includes a piezoelectric element sandwiched by a common electrode and a plurality of surface electrodes, the plurality of surface electrodes being formed on the piezoelectric element at positions corresponding to the respective pressure chambers, a plurality of first lands formed on the piezoelectric element to be connected to the respective surface electrodes, the first lands having a higher height from a surface of the piezoelectric element than that of the surface electrodes and being connected to the cable member, and a plurality of second lands formed on the piezoelectric element to be spaced from the respective surface electrodes, the second lands having substantially the same height from the surface of the piezoelectric element as that of the first lands.

According to the aforementioned aspect, the actuator unit including the piezoelectric element is arranged on the passage unit including the pressure chambers, and on the piezoelectric element, formed are not only the surface electrodes corresponding to the respective pressure chambers but also the first lands and the second lands corresponding to the respective surface electrodes. The first lands are connected to the respective surface electrodes, and the second lands are spaced from the respective surface electrodes. Both lands have substantially the same height from the surface of the piezoelectric element, which is higher than that of the surface electrodes. Like this, a total of two or more lands are provided for one surface electrode. As a result, when the actuator unit is adhered to the passage unit, pressure applied by a pressurizing member such as a heater can be dispersed. More specifically, the pressurizing member becomes in contact only with the first and second lands, and pressure of the pressurizing member is dispersed relatively well, through the first and second lands, over planes of the piezoelectric element and the passage unit. This makes uniform a thickness of an adhesive layer formed between the passage unit and the piezoelectric element, and accordingly prevents a variation in ink ejection characteristics.

In addition, the first lands are shaped into protrusions and their height from the surface of the piezoelectric element is higher than that of the surface electrodes. Consequently, when the cable member is disposed on the piezoelectric element, a relatively large space can be ensured between the cable member and the piezoelectric element. Further, the space can more surely be ensured by providing the second lands in addition to the first lands. This allows a stable connection of the first lands and the cable member, thereby suppressing overflow of a solder and thus preventing a short circuit between the neighboring surface electrodes. That is, the surface electrodes can be connected to the cable member with high reliability.

According to another aspect of the present invention, there is provided a method for manufacturing an ink-jet head comprising the steps of forming a passage unit that has a plurality of pressure chambers, a plurality of nozzles communicating with the respective pressure chambers, and a plurality of wall portions separating the pressure chambers from each other, and forming an actuator unit that changes the volume of the pressure chambers to thereby eject ink through the nozzles. The step of forming the actuator unit includes the steps of disposing, at a piezoelectric element, a plurality of surface electrodes and a common electrode opposing the plurality of surface electrodes, forming a plurality of first lands on the piezoelectric element to be connected to the respective surface electrodes, the first lands having a higher height from a surface of the piezoelectric element than that of the surface electrodes, and forming a plurality of second lands on the piezoelectric element to be spaced from the respective surface electrodes, the second lands having substantially the same height from the surface of the piezoelectric element as that of the first lands. The method for manufacturing an ink-jet head further comprises the steps of forming an adhesive layer on the wall portions of the passage unit, and positioning the actuator unit onto the passage unit such that the surface electrodes oppose the respective pressure chambers and both the first and second lands oppose the wall portions, and then disposing a pressurizing member on the actuator unit to press and adhere the actuator unit to the passage unit.

According to the aforementioned method, in the step of adhering the actuator unit to the passage unit, the first lands serving basically as contacts with the cable member are utilized and further the second lands are also utilized for dispersing pressure applied by the pressurizing member. Thus, an ink-jet head having the above-described effects can efficiently be manufactured.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

Figure 1:
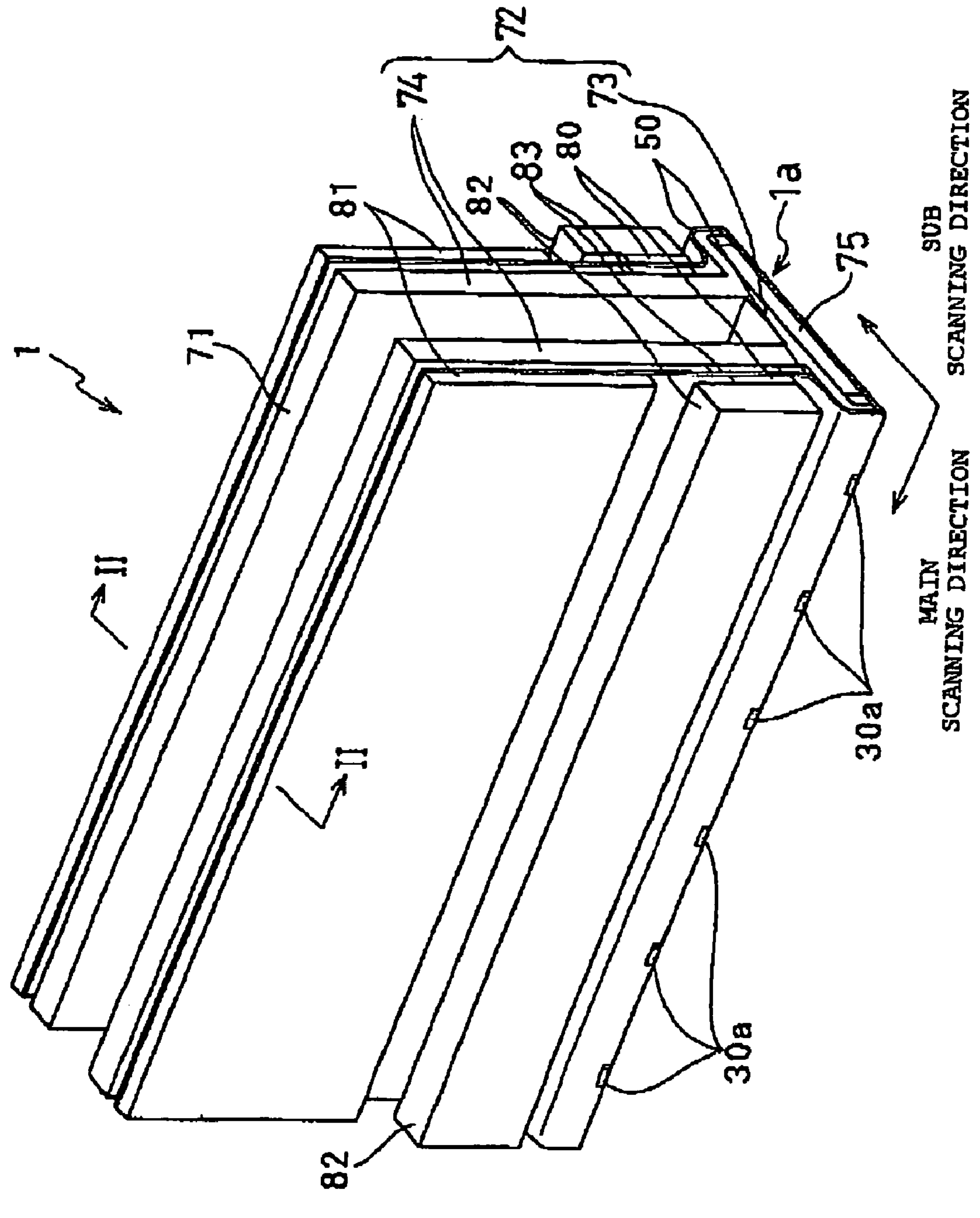
FIG. 1 is a perspective view of an ink-jet head according to an embodiment of the present invention.

First, a general structure of an ink-jet head according to an embodiment of the present invention will be described with reference to FIGS. 1, 2, and 3.

An ink-jet head 1 is used in an ink-jet printer of line-printing type. As illustrated in FIGS. 1 and 2, the ink-jet head 1 has a head main body 1*a* and a base 71 that supports the head main body 1*a*. The head main body 1*a* has, in a plan view, a rectangular shape extending in one direction, as a main scanning direction. The base 71 comprises a base block 75 partially bonded to the head main body 1*a*, and a holder 72 bonded to an upper face of the base block 75 for supporting the base block 75.

The base block 75, made of a metal material such as stainless steel, is a substantially rectangular parallelepiped member having substantially the same length as a longitudinal length of the head main body 1*a*. The base block 75 functions as a light-weight structure for reinforcing the holder 72. The holder 72 is made up of a holder main body 73 disposed near the head main body 1*a*, and a pair of holder supporters 74 each extending from the holder main body 73 in a direction opposite to a head main body 1*a* side. Each holder supporter 74 is configured as a flat plate member. These holder supporters 74 extend along a longitudinal direction of the holder main body 73 and are disposed in parallel with each other at a predetermined distance therebetween.

An elastic member 83 such as a sponge is adhered to an outer side face of each holder supporter 74. A flexible printed circuit (FPC) 50 as a cable member or flexible flat cable is arranged along the outer side face of each holder supporter 74 with the elastic member 83 interposed between them. A driver IC 80 is fixed to the FPC 50 so as to confront the elastic member 83. The FPC 50 is electrically connected to both the driver IC 80 and a later-described actuator unit 21. A heat sink 82 is disposed in close contact with an outer side face of the driver IC 80. The heat sink 82 of nearly rectangular parallelepiped shape efficiently dissipates heat generated in the driver IC 80.

A substrate 81 is placed outside the FPC 50 above the heat sink 82. Above the substrate 81, disposed is a controller (not illustrated) that conducts a general control over the ink-jet head 1. The driver IC 80, which is connected to the substrate 81, is capable of individual potential controls over each of many pressure chambers 10 (see FIG. 5) that are formed in a passage unit 4 as will be described later.

Figure 2:
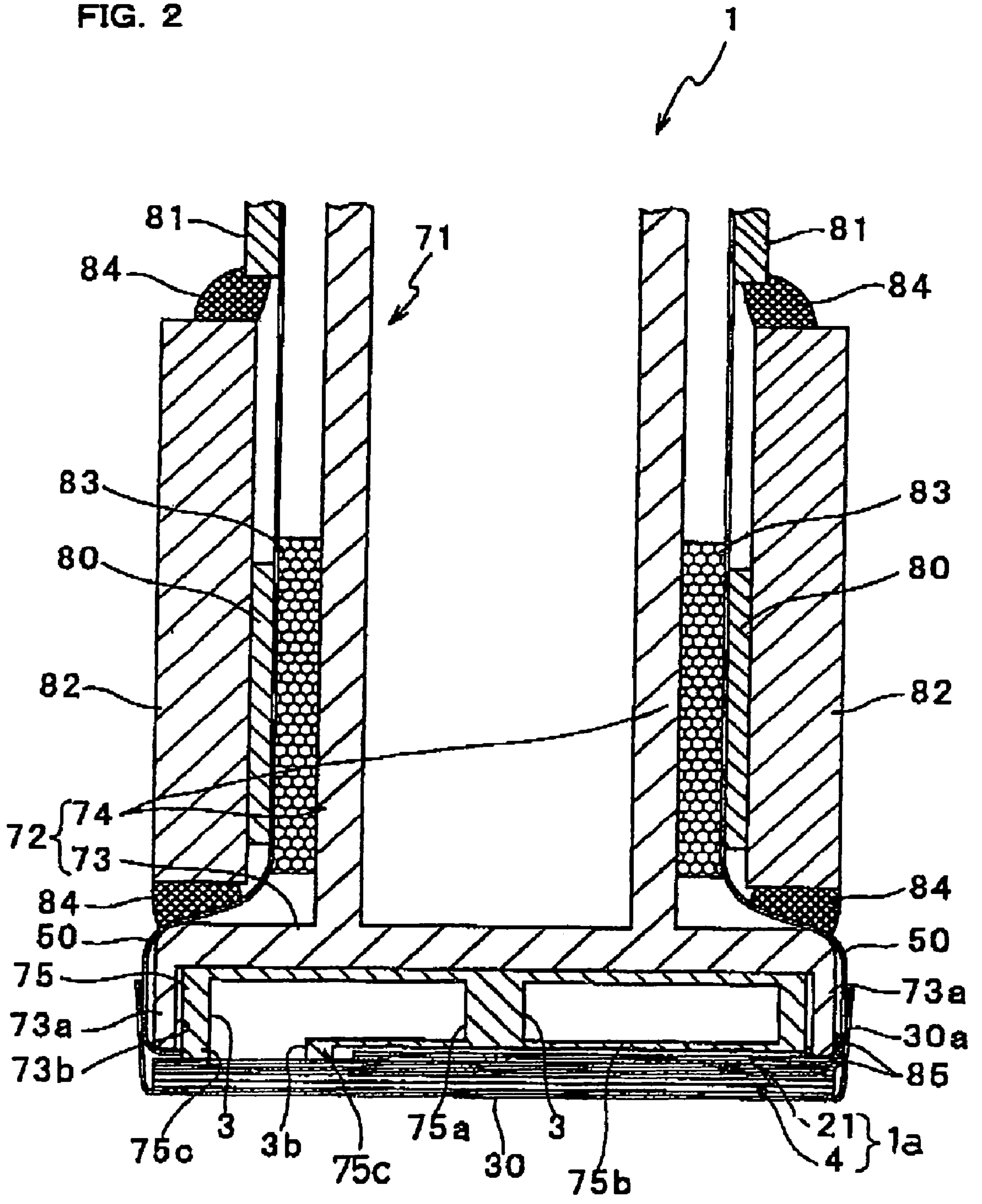
FIG. 2 is a sectional view taken along a line II-II of FIG. 1.

As illustrated in FIG. 2, seal members 84 are arranged between the heat sink 82 and the substrate 81 and between the heat sink 82 and the FPC 50. They are secured to each other with interposition of the seal member 84.

As illustrated in FIG. 2, a pair of skirt portions 73*a* protruding downward is formed at both ends of the holder main body 73 in a sub scanning direction, i.e., in a direction perpendicular to the main scanning direction (see FIG. 1). Each skirt portion 73*a* is formed throughout a whole length of the holder main body 73, thereby defining a substantially rectangular parallelepiped groove 73*b* on a lower face of the holder main body 73.

The base block 75 is received in the groove 73*b* of the holder main body 73, and has its upper face bonded to a bottom face of the groove 73*b* with an adhesive and the like. Within the base block 75, formed are two ink reservoirs 3 serving as passages for ink to be supplied to the head main body 1*a*. The ink reservoirs 3 are two substantially rectangular parallelepiped spaces or hollow regions extending along a longitudinal direction of the base block 75. The two ink reservoirs 3 are arranged along the longitudinal direction of the base block 75 in parallel with each other at a predetermined distance with interposition of a partition 75*a* formed along the longitudinal direction of the base block 75. In FIG. 3, the ink reservoirs 3 formed in the base block 75 are conceptionally illustrated with broken lines.

Referring to FIG. 2, an opening 3*b* (see FIG. 3) communicating with the ink reservoir 3 is formed at a lefthand position, as corresponding to the ink reservoir 3, on a lower face 75*b* of the base block 75. As illustrated in FIG. 3, pairs of openings 3*b* are arranged in a zigzag pattern in an extending direction of the ink reservoirs 3 in areas where the later-described actuator unit 21 is not placed. Each opening 3*b* is provided with a filter (not illustrated) for catching dust and dirt that may be contained in ink. In the lower face 75*b* of the base block 75, a vicinity of the opening 3*b* protrudes downward from surroundings thereof, as illustrated in FIG. 2.

Figure 3:
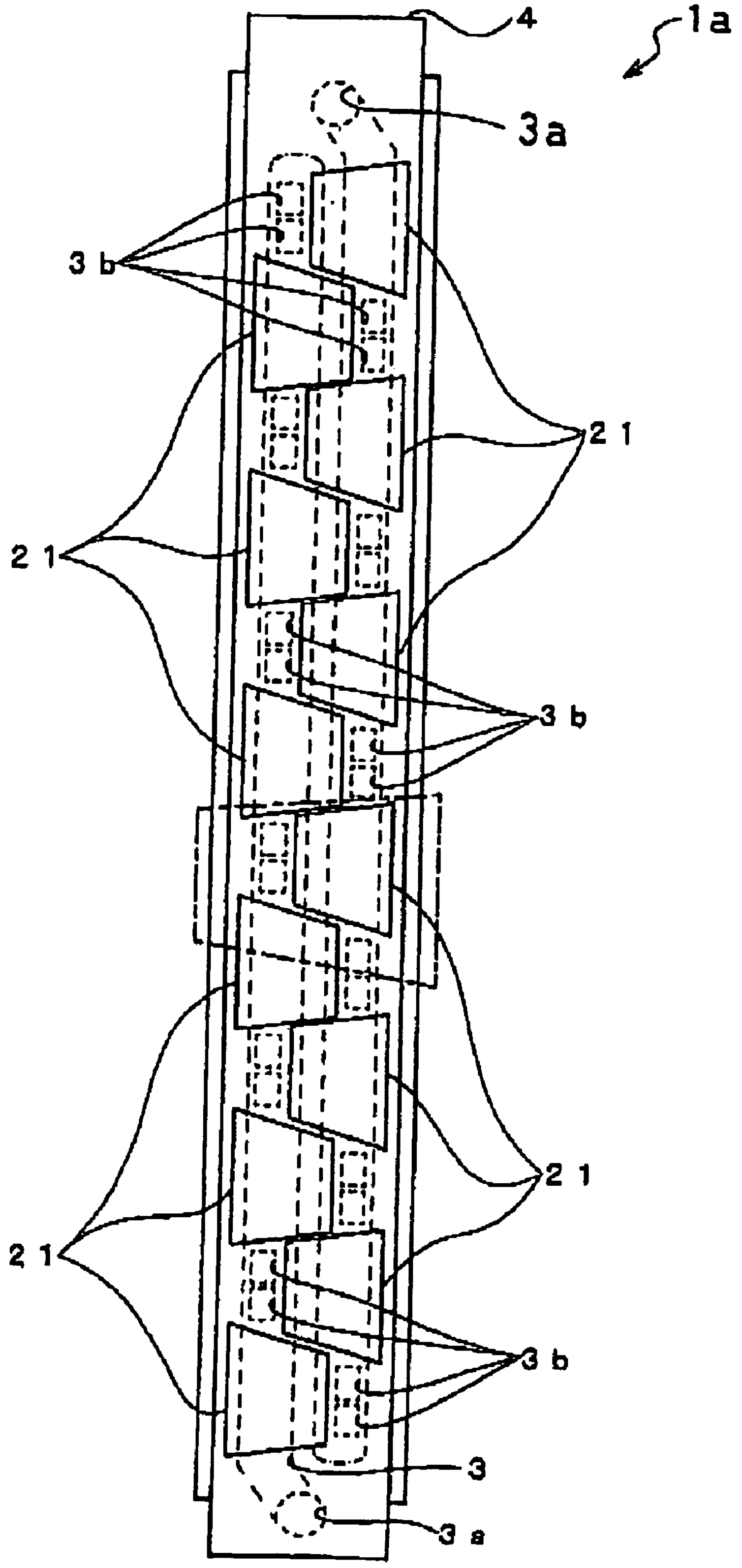
FIG. 3 is a plan view of a head main body included in the ink-jet head illustrated in FIG. 1.

As illustrated in FIG. 3, each ink reservoir 3 communicates at one end thereof with an opening 3*a*. Ink is suitably supplied from an ink tank (not illustrated) via the opening 3*a* to each ink reservoir 3, so that the ink reservoir 3 is always filled up with ink.

As illustrated in FIG. 2, the head main body 1*a* supported below the base block 75 comprises a passage unit 4 and a plurality of actuator units 21 (only one of which is illustrated in FIG. 2) that are adhered to an upper face of the passage unit 4. The base block 75 is bonded to the head main body 1*a*, in more detail, bonded to the passage unit 4 of the head main body 1*a*, only at a vicinity 75*c* of each opening 3*b* of the lower face 75*b*. An area of the lower face 75*b* of the base block 75, other than the vicinity 75*c* of each opening 3*b*, is spaced from the head main body 1*a*. The actuator units 21 are disposed within this space. Thus, the actuator units 21 and the base block 75 are kept out of contact with each other.

Figure 4:
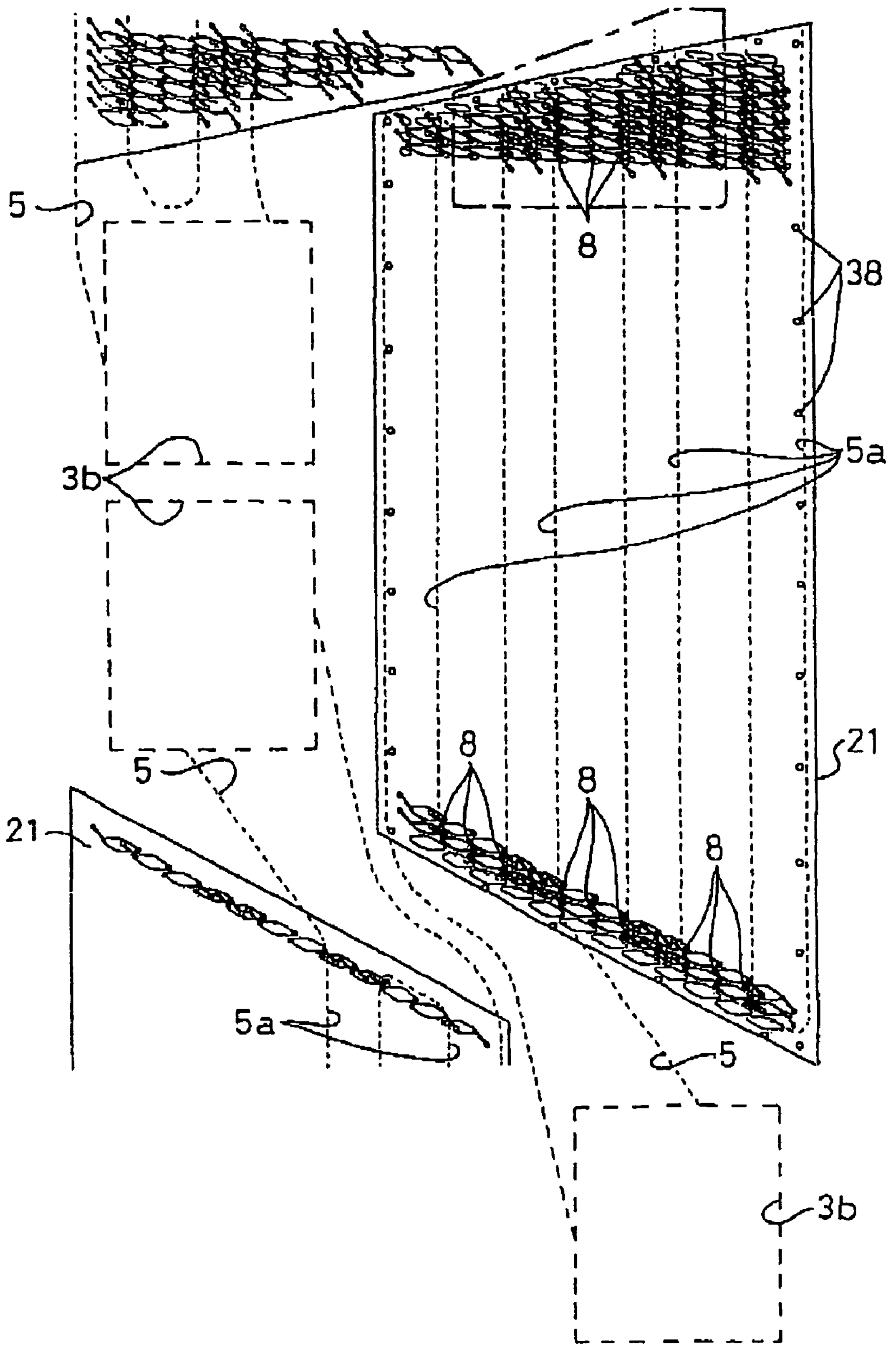
FIG. 4 is an enlarged view of a region enclosed with an alternate long and short dash line illustrated in FIG. 3.

As illustrated in FIG. 3, each actuator unit 21 has, in a plan view, a trapezoidal shape having parallel opposed sides, i.e., upper and lower sides, extending along the longitudinal direction of the head main body 1*a*. The actuator units 21 are arranged between the pairs of openings 3*b* in a zigzag pattern. Neighboring oblique sides of the actuator units 21 overlap each other in a widthwise direction of the head main body 1*a*. Areas of a lower face of the passage unit 4 corresponding to regions adhered to the actuator units 21 are made into ink ejection regions. A large number of nozzles 8 (see FIG. 4) are arranged on a surface of the ink ejection regions, as will be described later. Although FIG. 4 illustrates only a part of the nozzles 8, the nozzles 8 are arranged over a whole region corresponding to the region adhered to the actuator unit 21. The FPC 50 is jointed to a surface of the actuator unit 21, which will be described later.

As illustrated in FIG. 2, a seal member 85 is disposed around a tip end of the skirt portion 73*a* of the holder main body 73. This seal member 85 secures the FPC 50 to the passage unit 4 and the holder main body 73. As a result, the FPC 50 is hardly bent even if the head main body 1*a* becomes longer. Moreover, an interconnecting portion between the actuator unit 21 and the FPC 50 can be prevented from receiving stress, and the FPC 50 can be securely held in place.

Referring to FIG. 1, in a vicinity of each lower corner of the ink-jet head 1 along the main scanning direction, six protruding portions 30*a* are disposed at a regular interval along a sidewall of the ink-jet head 1. As illustrated in FIG. 2, these protruding portions 30*a* are provided at both ends, in the sub scanning direction, of a nozzle plate 30 (see FIG. 6) that is a lowermost layer of the head main body 1*a*. That is, the nozzle plate 30 is bent at an angle of approximately 90 degrees along a boundary between each protruding portion 30*a* and the other portion. The protruding portions 30*a* are formed at positions corresponding to vicinities of both ends of various-sized papers to be used for printing. Since bent portions of the nozzle plate 30 are not right-angled but rounded, there is hardly caused a paper jam, which may occur because a leading edge of the paper having been transferred to the head 1 is stopped by a side face of the head 1.

Next, a construction of the passage unit 4 is detailed with reference to FIGS. 4 to 8.

In the passage unit 4, formed are manifold channels 5 (as illustrated with broken lines in FIG. 4) communicating with the openings 3*b* so that ink reserved in the ink reservoirs 3 of the base block 75 may be introduced into the manifold channels 5. Front end portion of each manifold channel 5 branches into two sub-manifold channels 5*a*. In a region corresponding to one actuator unit 21, two sub-manifold channels 5*a* extend from each of two openings 3*b* located on both sides of that actuator unit 21 in the longitudinal direction of the ink-jet head 1. That is, in a region of the passage unit 4 corresponding to one actuator unit 21, four sub-manifold channels 5*a* in total extend along the longitudinal direction of the ink-jet head 1. A location, in a sectional view, of each sub-manifold channel 5*a* in the passage unit 4 is as illustrated in FIG. 6.

Figure 5:
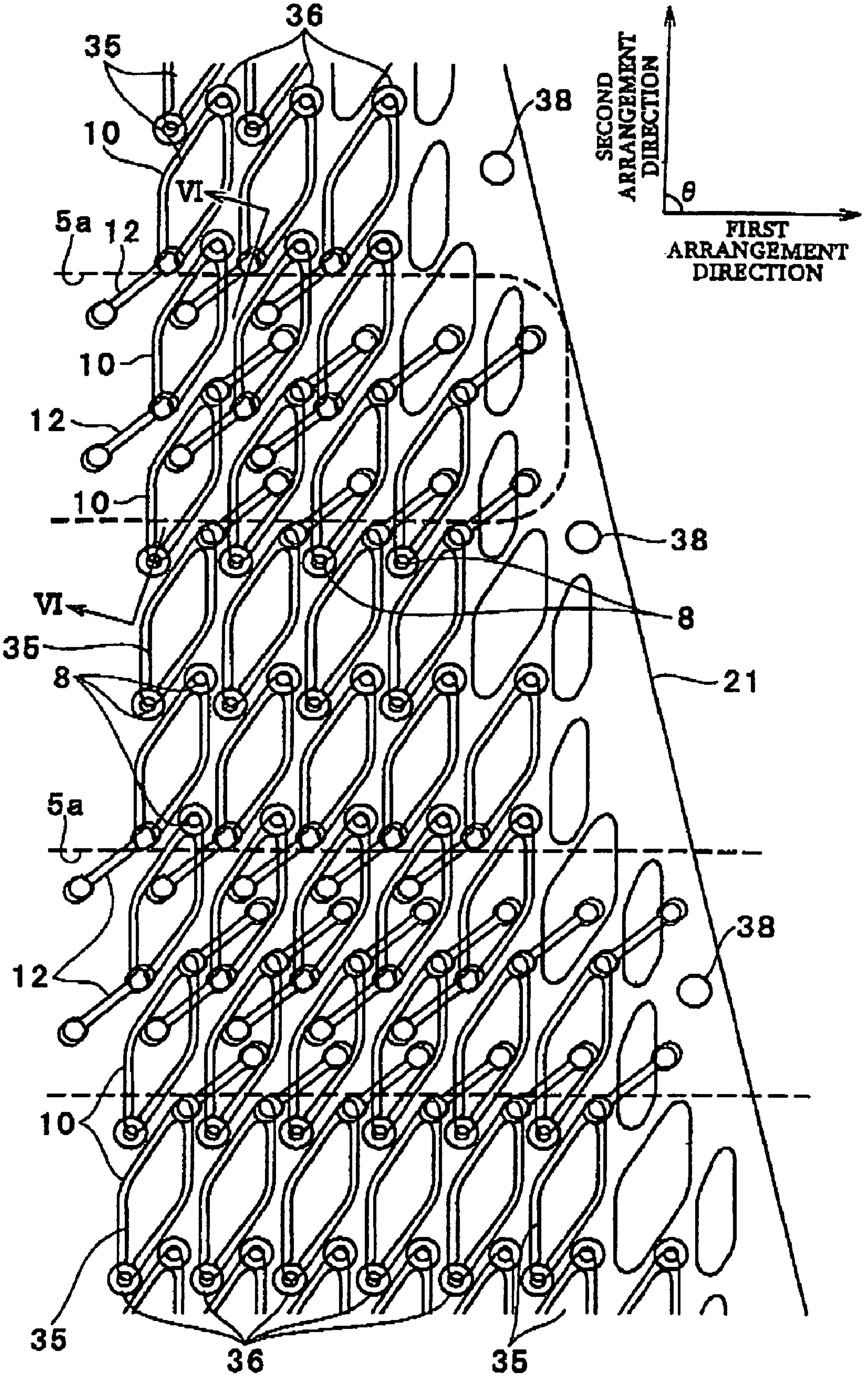
FIG. 5 is an enlarged view of a region enclosed with an alternate long and short dash line illustrated in FIG. 4.
Figure 6:
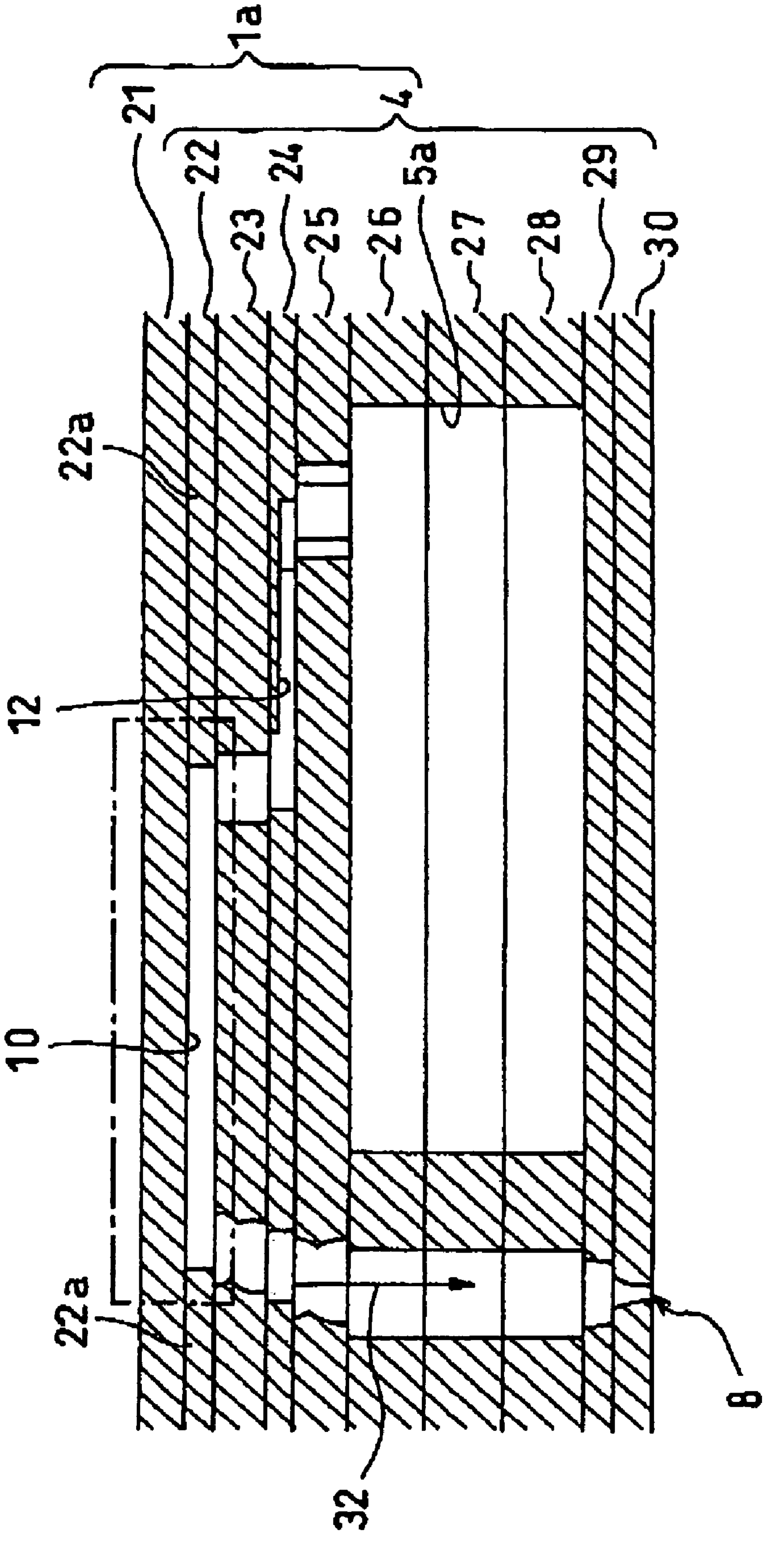
FIG. 6 is a partial sectional view of the head main body illustrated in FIG. 3 as taken along a line VI-VI of FIG. 5.

Referring to FIG. 6, many openings to serve as the pressure chambers 10 are formed in an uppermost plate in the passage unit 4, i.e., a later-detailed cavity plate 22, to a surface of which the actuator units 21 are to be adhered. Within the ink ejection regions that correspond to areas adhered to the actuator units 21, the pressure chambers 10*a* are arranged adjacently to each other on the surface of the passage unit 4, as illustrated in FIGS. 4 and 5.

As illustrated in FIG. 6, the pressure chamber 10 communicates with the sub-manifold channel 5*a* through an aperture 12. The aperture 12 is for restricting ink flow and thus applying a suitable passage resistance, to thereby stabilize an ink ejection. The aperture 12 is elongated in parallel with the pressure chamber 10, i.e., in parallel with the surface of the passage unit 4. As illustrated in FIG. 5, one end of the aperture 12 is located in a region of the sub-manifold channel 5*a*, and the other end thereof is located at an acute-angled portion of the pressure chamber 10 having a substantially rhombic shape.

Further, referring to FIG. 6, many openings serving as the nozzles 8 are formed in the nozzle plate 30 that is the lowermost layer of the passage unit 4. As illustrated in FIGS. 4 and 5, the nozzles 8 are arranged within the ink ejection region corresponding to the area adhered to the actuator unit 21. The nozzles 8 are positioned outside the ranges of the sub-manifold channels 5*a*, and substantially correspond to one acute-angled portion of the respective pressure chambers 10 of rhombic shape.

FIGS. 4 and 5 show the lower face of the passage unit 4, and therefore should illustrate with broken lines the pressure chambers 10 and the apertures 12, which are however illustrated with solid lines for easy understanding. In a plan view, one pressure chamber 10 overlaps two apertures 12, as illustrated in FIG. 5. This arrangement is achieved by providing the pressure chambers 10 and the apertures 12 at different levels from each other, as illustrated in FIG. 6. This enables a highly dense arrangement of the pressure chambers 10, and also a high-resolution image formation using the ink-jet head 1 that occupies a relatively small area.

Here will be described an arrangement of the pressure chambers 10 and the nozzles 8 in a plane parallel to the surface of the passage unit 4.

Within the ink ejection regions, both the pressure chambers 10 and the nozzles 8 are arranged in a matrix in two directions, i.e., a direction along a length of the ink-jet head 1 as the first arrangement direction and a direction slightly inclined relative to a width of the ink-jet head 1 as the second arrangement direction. The first and second arrangement directions form an angle theta, θ, somewhat smaller than the right angle. The nozzles 8 are arranged at 50 dpi in the first arrangement direction. The pressure chambers 10 are, on the other hand, arranged such that one ink ejection region corresponding to the area adhered to one actuator unit 21 may contain twelve pressure chambers 10 at the maximum in the second arrangement direction. An amount of shift in the first arrangement direction caused by arranging twelve pressure chambers 10 in the second arrangement direction is equivalent to one pressure chamber 10. Therefore, throughout a width of the ink-jet head 1, twelve nozzles 8 exist within a range that corresponds to an interval between two neighboring nozzles 8 in the first arrangement direction. At both ends of each ink ejection region in the first arrangement direction, i.e., at portions corresponding to oblique sides of each actuator unit 21, one ink ejection region is complementary to another ink ejection region corresponding to an actuator unit 21 located opposite in the widthwise direction of the ink-jet head 1, to thereby satisfy the above-mentioned condition.

Accordingly, the ink-jet head 1 can perform printing at 600 dpi in the main scanning direction by sequentially ejecting ink droplets through the many nozzles 8 arranged in the first and second arrangement directions, in association with relative movement of a paper along the sub scanning direction of the ink-jet head 1.

Figure 7:
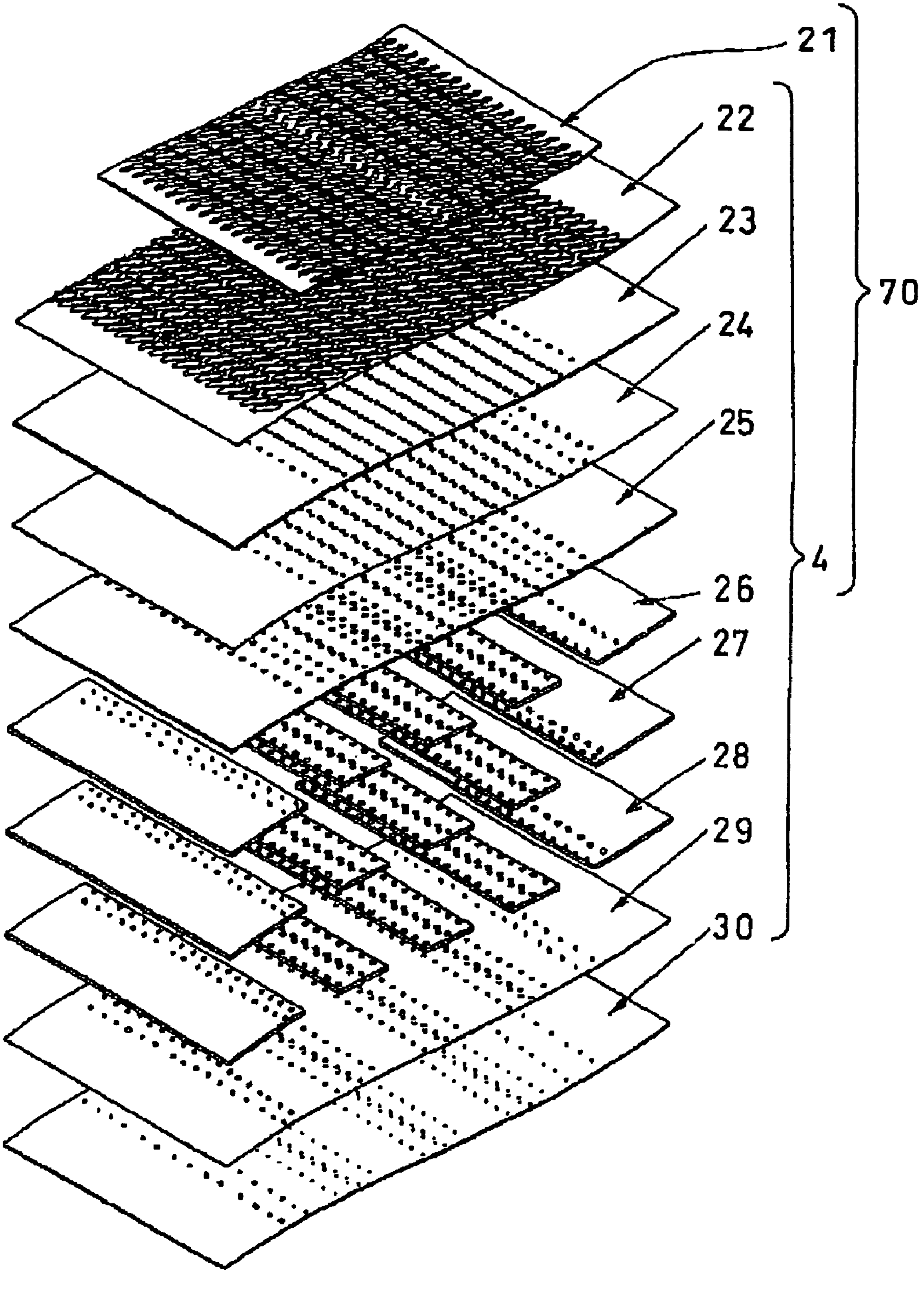
FIG. 7 is a partial exploded perspective view of the head main body illustrated in FIG. 6 and a flexible printed circuit attached to the head main body.

Referring to FIGS. 6 and 7, the passage unit 4 has a layered structure including nine plates in total, i.e., from the top, a cavity plate 22, a base plate 23, an aperture plate 24, a supply plate 25, manifold plates 26, 27, and 28, a cover plate 29, and a nozzle plate 30. These plates 22 to 30 are made of metal such as stainless steel, etc.

Many substantially rhombic openings to serve as the pressure chambers 10 are formed in the cavity plate 22. Portions of the cavity plate 22 having no openings formed therein constitute wall portions 22*a* that define the respective pressure chambers 10. In the base plate 23, both of one communication hole between a pressure chamber 10 and a corresponding aperture 12 and one communication hole between a pressure chamber 10 and a corresponding nozzle 8 are provided for each pressure chamber 10 formed in the cavity plate 22. In the aperture plate 24, both of one opening to serve as an aperture 12 and a communication hole between a pressure chamber 10 and a corresponding nozzle 8 are provided for each pressure chamber 10 formed in the cavity plate 22. In the supply plate 25, both of one communication hole between an aperture 12 and a sub-manifold channel 5*a* and one communication hole between a pressure chamber 10 and a corresponding nozzle 8 are provided for each pressure chamber 10 formed in the cavity plate 22. In each of the manifold plates 26, 27, and 28, in addition to an opening to serve as the sub-manifold channel 5*a*, one communication hole between a pressure chamber 10 and a corresponding nozzle 8 is provided for each pressure chamber 10 formed in the cavity plate 22. In the cover plate 29, one communication hole between a pressure chamber 10 and a corresponding nozzle 8 is provided for each pressure chamber 10 formed in the cavity plate 22. In the nozzle plate 30, one tapered opening to serve as a nozzle 8 is provided for each pressure chamber 10 formed in the cavity plate 22.

In the passage unit 4, formed are ink passages 32 (see FIG. 6) each extending from the ink tank (not illustrated), through the ink reservoir 3, the manifold channel 5, the sub-manifold channel 5*a*, the aperture 12, and the pressure chamber 10, to the nozzle 8. The ink passage 32 firstly extends upward from the sub-manifold channel 5*a*, then extends horizontally in the aperture 12, then further extends upward, then again extends horizontally in the pressure chamber 10, then extends obliquely downward to a certain extent away from the aperture 12, and then extends vertically downward toward the nozzle 8.

Figure 8A:
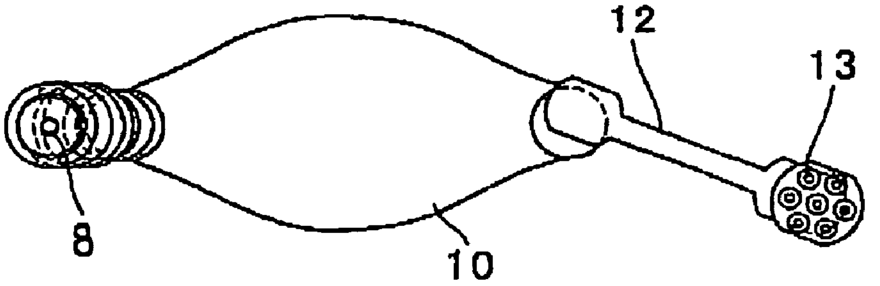
FIG. 8A is a plan view of a space that forms an ink passage illustrated in FIG. 6.
Figure 8B:
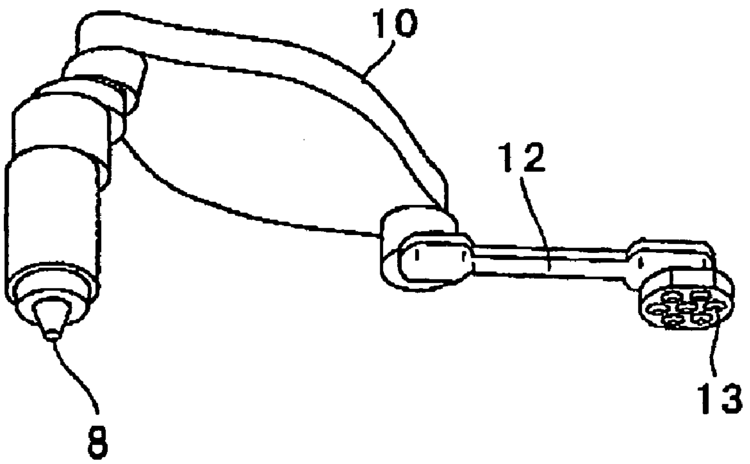
FIG. 8B is a perspective view of the space that forms the ink passage illustrated in FIG. 6.

FIGS. 8A and 8B show a plan view and a perspective view, respectively, of a configuration of a space that forms the ink passage 32 in the passage unit 4 illustrated in FIG. 6. In FIGS. 8A and 8B, shown is a filter 13 provided at a boundary between the aperture 12 and the sub-manifold channel 5*a*. The filter 13 is for removing dust contained in ink.

A construction of the actuator unit 21 will then be detailed with reference to FIGS. 9 and 10.

The actuator unit 21, including four piezoelectric sheets 41, 42, 43, and 44 put in layers, is adhered onto the cavity plate 22 as the uppermost layer of the passage unit 4 with an adhesive layer 70 (see FIG. 9) interposed between them. These piezoelectric sheets 41 to 44 constitute a piezoelectric element. Each of the piezoelectric sheets 41 to 44 has a thickness of approximately 15 μm, and is made of a lead zirconate titanate (PZT)-base ceramic material, which has good workability and ferroelectricity.

The piezoelectric sheets 41 to 44 are formed into a piece of layered flat plate spanning the many pressure chambers 10 formed within one ink ejection region in the ink-jet head 1. As a result, mechanical rigidity of the piezoelectric sheets 41 to 44 can be kept high, and further the ink-jet head 1 obtains improved responsiveness for ink ejection.

Individual electrodes 35 as surface electrodes having a thickness of approximately 1 μm are formed on the uppermost piezoelectric sheet 41. The individual electrodes 35 correspond to the respective pressure chambers 10. As illustrated in FIG. 10, the individual electrode 35 has a main electrode portion 35*x* and a connecting portion 35*y*. The main electrode portion 35*x* opposes the pressure chamber 10, and has, in a plan view, a substantially rhombic shape with a length of 850 μm and a width of 250 μm similar to that of the pressure chamber 10. One acute-angled portion of the main electrode portion 35*x* extends out to form the connecting portion 35*y* that opposes the wall portion 22*a* of the cavity plate 22.

Figure 9:
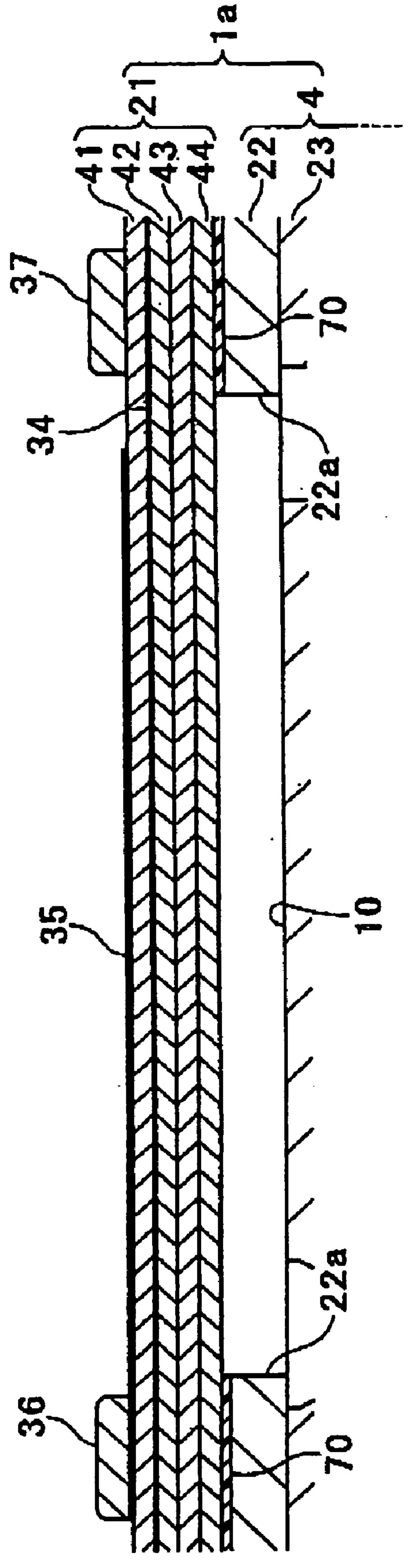
FIG. 9 is an enlarged view of a region enclosed with an alternate long and short dash line illustrated in FIG. 6.

A common electrode 34 having a thickness of approximately 2 μm is interposed between the piezoelectric sheet 41 and the piezoelectric sheet 42 disposed under the piezoelectric sheet 41 (see FIG. 9). The common electrode 34 is a single conductive sheet extending over substantially an entire surface of one actuator unit 21. Both the individual electrodes 35 and the common electrode 34 are made of, e.g., an Ag—Pd-base metallic material, and serve to change the volume of the pressure chambers 10 by applying an electric field to the piezoelectric sheet 41 for deformation, as will be described later.

No electrode is disposed between the piezoelectric sheet 42 and the piezoelectric sheet 43 disposed under the piezoelectric sheet 42, between the piezoelectric sheet 43 and the piezoelectric sheet 44, and under the piezoelectric sheet 44.

As shown in FIGS. 4 and 5, a region of the surface of the actuator unit 21 where the individual electrodes 35 are formed is enclosed, over its whole circumference, with circular ground electrodes 38. In other words, many ground electrodes 38 are formed at substantially the same interval around an outer periphery of the surface of the piezoelectric sheet 41 of a trapezoidal shape. All the ground electrodes 38 are connected to the common electrode 34 via through holes (not illustrated) formed in the piezoelectric sheet 41, although FIG. 9 has no illustration thereof.

A driving method of the actuator unit 21 will here be described.

The piezoelectric sheets 41 to 44 included in the actuator unit 21 have been polarized in their thickness direction. Portions of the piezoelectric sheet 41 sandwiched between the individual electrodes 35 and the common electrode 34 act as active portions. In this case, when an individual electrode 35 is set at a different potential from that of the common electrode 34 to apply an electric field in a polarization direction to a corresponding active portion of the piezoelectric sheet 41, the active portion expands or contracts in its thickness direction, and, by a transversal piezoelectric effect, contracts or expands in its plane direction that is perpendicular to the thickness direction. On the other hand, the other three piezoelectric sheets 42 to 44 are non-active layers having no region sandwiched between electrodes, and therefore cannot deform by themselves. That is, the actuator unit 21 has a so-called unimorph structure in which an upper piezoelectric sheet 41 distant from the pressure chamber 10 is a layer including active portions and the lower three piezoelectric sheets 42 to 44 near the pressure chamber 10 are inactive layers.

In this construction, when an electric field is applied in the polarization direction to an active portion of the piezoelectric sheet 41, the active portion expands in the thickness direction and contracts in the plane direction while the other three piezoelectric sheets 42 to 44 exhibit no deformation. At this time, since a lowermost face of the piezoelectric sheets 41 to 44 is fixed to upper faces of the wall portions 22*a* of the cavity plate 22 as illustrated in FIG. 9, the piezoelectric sheet 41 to 44 as a whole deform to protrude toward a pressure chamber 10 side (i.e., unimorph deformation) in association with the deformation of the active portion of the piezoelectric sheet 41. This reduces the volume of the pressure chamber 10 and raises pressure of ink in the pressure chamber 10, and thereby the ink is ejected through the nozzle 8. Then, when the individual electrode 35 is again set at the same potential as that of the common electrode 34, the piezoelectric sheets 41 to 44 restore their original shape of flat plate. At this time, the volume of the pressure chamber 10 increases, and accordingly ink in the sub-manifold channel 5*a* is introduced into the pressure chamber 10.

In another possible driving method, all the individual electrodes 35 are in advance kept at a different potential from that of the common electrode 34 so that the piezoelectric sheets 41 to 44 as a whole deform to protrude toward the pressure chamber 10 side. Then, upon every ejection request, a corresponding individual electrode 35 is once set at the same potential as that of the common electrode 34. Thereafter, at a predetermined timing, the individual electrode 35 is again set at the different potential from that of the common electrode 34. In this case, at a timing when the individual electrode 35 and the common electrode 34 have the same potential, the piezoelectric sheets 41 to 44 restore their original shape of flat plate, and a corresponding pressure chamber 10 thereby increases in volume as compared with its initial state, where the piezoelectric sheets 41 to 44 as a whole deform to protrude toward the pressure chamber 10 side. As the pressure chamber 10 increases in volume, ink in the sub-manifold channel 5*a* is introduced into the pressure chamber 10. Thereafter, at a timing when the potentials of the individual electrode 35 and the common electrode 34 become different from each other, the piezoelectric sheets 41 to 44 as a whole deform to protrude toward the pressure chamber 10 side. This reduces the volume of the pressure chamber 10 and raises pressure of ink in the pressure chamber 10, and thereby the ink is ejected through the nozzle 8.

When, on the other hand, an electric field perpendicular to the polarization direction is applied to an active portion of the piezoelectric sheet 41, the active portion expands in its plane direction and contracts in its thickness direction. At this time, the piezoelectric sheets 41 to 44 as a whole deform to be concaved on the pressure chamber 10 side. This increases the volume of the pressure chamber 10, and thereby ink in the sub-manifold channel 5*a* is introduced into the pressure chamber 10. Then, when a potential of the individual electrode 35 returns to its initial value, the piezoelectric sheets 41 to 44 restore their original shape of flat plate. This reduces the volume of the pressure chamber 10 and raises pressure of ink in the pressure chamber 10, and thereby the ink is ejected through the nozzle 8.

Then, a description will be given to a land 36 and a dummy land 37 as a second land both formed on the surface of the piezoelectric sheet 41 to correspond to each individual electrode 35.

Figure 10:
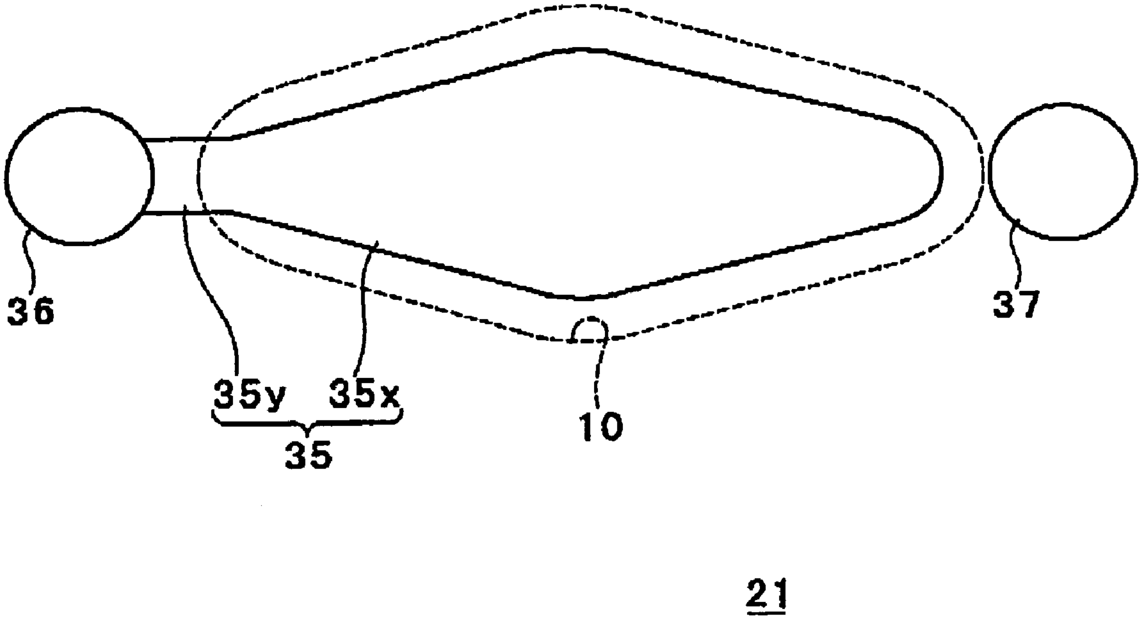
FIG. 10 is a plan view showing a shape of one individual electrode formed on a surface of an actuator unit, and shapes of a land and a dummy land corresponding to that individual electrode.

The land 36 is disposed on the surface of the piezoelectric sheet 41 as illustrated in FIG. 9, and more specifically disposed at an end of the connecting portion 35*y* distant from the main electrode portion 35*x* as illustrated in FIG. 10. That is, the land 36 is so provided as to oppose the wall portion 22*a* and to be connected to the individual electrode 35. The land 36 is shaped into a column having a diameter of approximately 160 μm and a thickness of approximately 10 μm, and made of, e.g., gold including glass frits. FIG. 9 shows that a height of the land 36 from the surface of the piezoelectric sheet 41 is higher than that of the individual electrode 35. Since the land 36 has the thickness of approximately 10 μm and the individual electrode 35 has the thickness of approximately 1 μm, the height of the land 36 from the surface of the piezoelectric sheet 41 is approximately 11 μm.

As shown in FIGS. 9 and 10, a dummy land 37 and a land 36 make a pair, and are positioned symmetrically with respect to a center of a corresponding pressure chamber 10. The dummy land 37 is, similarly to the land 36, so provided as to oppose the wall portion 22*a*, made of gold including glass frits, and has substantially the same diameter of approximately 160 μm and substantially the same thickness of 10 μm as those of the land 36. Since the land 36 is formed on the individual electrode 35, there exists 1 μm difference between the land 36 and the dummy land 37 in height from the surface of the piezoelectric sheet 41, however, the difference is in permissible variation in manufacturing the land 36, the dummy land 37, and the FPC 50, etc. The dummy land 37 is spaced from the individual electrode 35 without electrical connection thereto, while the land 36 is connected to the individual electrode 35.

Figure 11A:
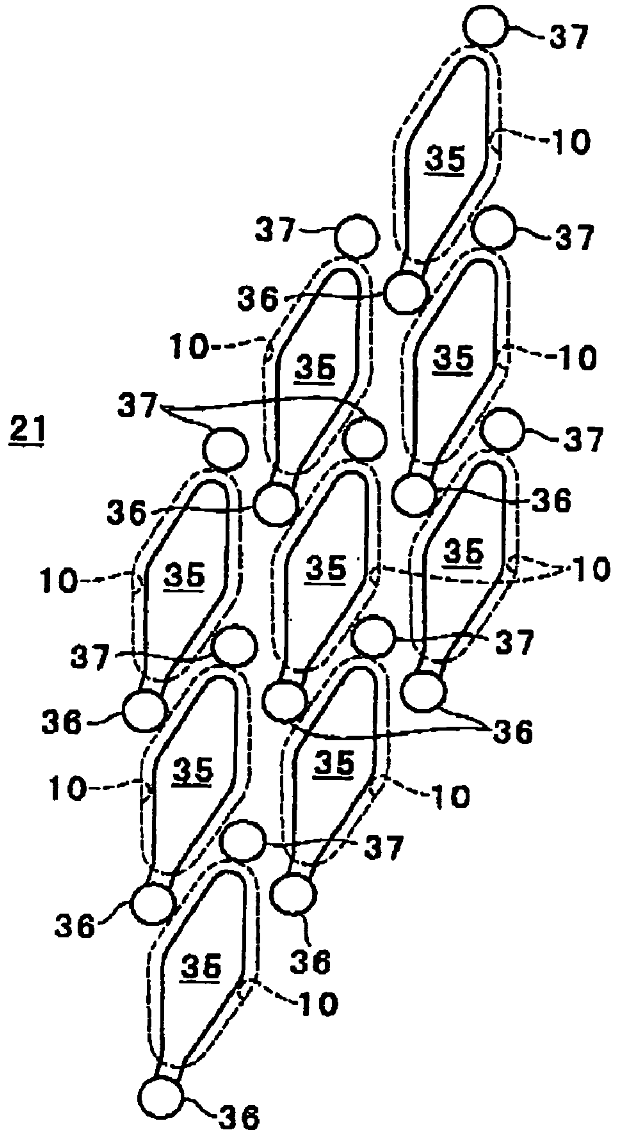
FIG. 11A is a partial plan view showing individual electrodes, lands, and dummy lands arranged on the surface of the actuator unit.
Figure 11B:
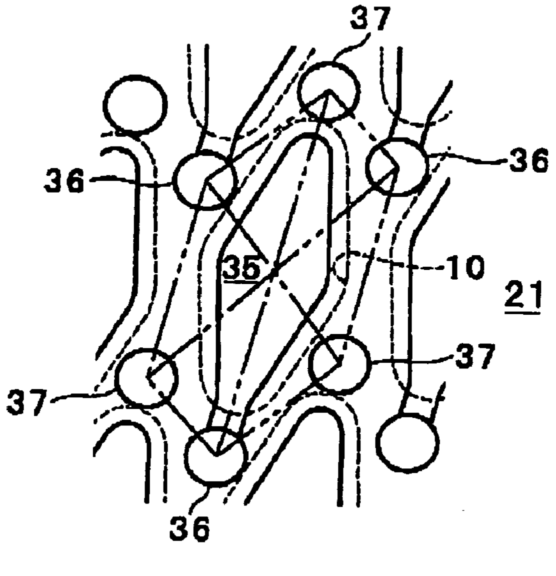
FIG. 11B is a partial enlarged view showing one of the individual electrodes illustrated in FIG. 11A, and the lands and the dummy lands surrounding that individual electrode.

Referring to FIGS. 11A and 11B, each of the individual electrodes 35 is surrounded with the corresponding land 36 and dummy land 37 in a pair, and is also surrounded with lands 36 and dummy lands 37 corresponding to other individual electrodes 35 adjacent to the individual electrode 35. Referring to FIG. 11B, further, around each individual electrode 35, disposed are six lands 36 and dummy lands 37 including the lands 36 and dummy lands 37 corresponding to other individual electrodes 35 adjacent to the individual electrode 35. The three lands 36 and the three dummy lands 37 make pairs, and each pair is positioned symmetrically with respect to a center of a corresponding pressure chamber 10. The three lands 36 and the three dummy lands 37 are arranged in a hexagonal formation.

Figure 12:
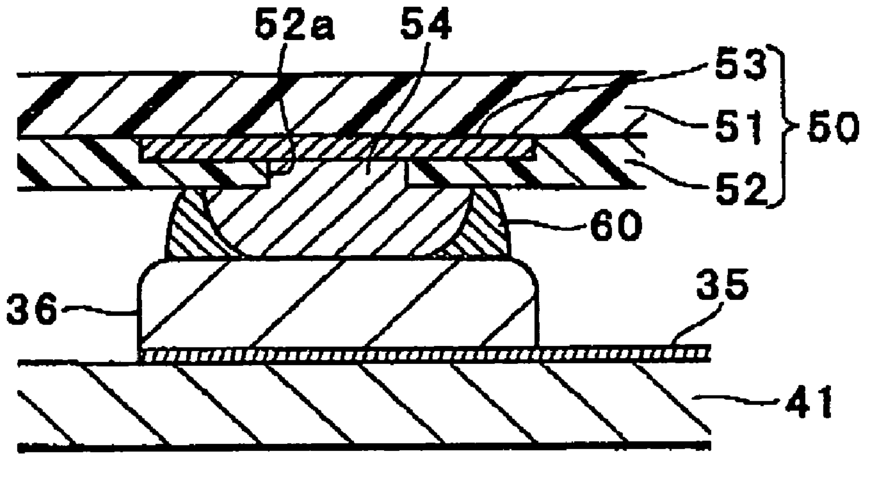
FIG. 12 is an enlarged sectional view showing a state where a terminal of the flexible printed circuit is connected to the land of the actuator unit.

Next, a construction of the FPC 50 will be described in detail with reference to FIG. 12.

The FPC 50 includes a base film 51, a plurality of conductive patterns 53 formed on a lower face of the base film 51, a cover film 52 covering substantially an entire lower face of the base film 51, and terminals 54 protruding from a lower face of the cover film 52. The base film 51, the conductive patterns 53, and the cover film 52 have thicknesses of approximately 25 μm, 9 μm, and 20 μm, respectively. A plurality of through holes 52*a*, each having a smaller area than that of the conductive pattern 53, are formed in the cover film 52. Each through hole 52*a* corresponds to each of the plurality of conductive patterns 53. The base film 51, the conductive patterns 53, and the cover film 52 are positioned in layers such that a center of each through hole 52*a* may correspond to a center of each conductive pattern 53 and the cover film 52 may cover outer peripheries of the conductive patterns 53.

The base film 51 and the cover film 52 are insulative sheet members. The base film 51 is made of a polyimide resin, and the cover film 52 is made of a photosensitive material. Like this, by making the cover film 52 from a photosensitive material, the many through holes 52*a* can easily be formed.

The conductive patterns 53 are made of a copper foil. The conductive patterns 53 are wirings for transmitting to the actuator units 21 drive signals outputted from the driver IC 80 (see FIGS. 1 and 2). The conductive patterns 53 are connected to the driver IC 80, and form predetermined patterns on the lower face of the base film 51.

The terminals 54, made of a conductive material such as nickel, are connected through the through holes 52*a* of the cover film 52 to the conductive patterns 53. More specifically, the terminal 54 is so formed as to close the through hole 52*a*, to cover an outer periphery of the through hole 52*a* on a side of the lower face of the cover film 52, and to protrude toward a piezoelectric sheet 41 side. A diameter of the terminal 54 is approximately 50 μm, and a protrusion length of the terminal 54 from the lower face of the cover film 52 is approximately 30 μm.

Each terminal 54 corresponds to one of the lands 36. A terminal 54 and a corresponding land 36 are connected to each other with a solder 60. Since the terminal 54 is connected to the conductive pattern 53, each individual electrode 35 electrically connected to the corresponding land 36 becomes in connection with the driver IC 80 through the conductive pattern 53 formed independently of one another on the FPC 50. This allows individual potential controls over each of the pressure chambers 10.

The FPC 50 has no terminals to correspond to the dummy lands 37. This is because, as mentioned above, the dummy lands 37 are not electrically connected to the individual electrodes 35.

In addition to the above-described conductive patterns 53, the FPC 50 has ground conductive patterns (not illustrated) as well. Terminals of the ground conductive patterns (not illustrated) are connected to the above-mentioned ground electrodes 38 (see FIGS. 4 and 5), so that the common electrode 34 connected to the ground electrodes 38 is kept at the ground potential equally in its region corresponding to any pressure chamber 10.

Next, an example of methods for manufacturing the ink-jet head 1 will be described.

When forming the head main body 1*a*, in this example, the passage unit 4 and the actuator unit 21 are prepared separately from each other and subsequently adhered to each other.

In order to manufacture the passage unit 4, first, each of the nine plates 22 to 30 is subjected to etching with a mask of patterned photoresist, thereby forming openings and recesses as illustrated in FIGS. 6 and 7 in each of the plates 22 to 30. Subsequently, the plates 22 to 30 are overlaid on and bonded to one another with an adhesive such that they may form the ink passage 32 as illustrated in FIG. 6.

In order to manufacture the actuator unit 21, first, a conductive paste to develop into the common electrode 34 is printed in a pattern on a green sheet of a ceramic material to develop into the piezoelectric sheet 42. The four piezoelectric sheets 41 to 44 are then positioned and overlaid on one another using a jig, and formed into one piece through firing at a predetermined temperature. Subsequently, a conductive paste to develop into the individual electrodes 35 is printed in a pattern on the piezoelectric sheet 41. Thereafter, a firing process is performed. Further, a conductive paste to develop into each land 36 is printed in a pattern on one end of the individual electrode 35, more specifically on the connecting portion 35*y* of each individual electrode 35. A conductive paste to develop into each dummy land 37 is printed in a pattern at a position substantially symmetric to a land 36 paired therewith with respect to a center of their corresponding pressure chamber 10. The pastes are sintered through a subsequent firing process. As a result, the individual electrodes 35, the lands 36, and the dummy lands 37 are formed on the surface of the piezoelectric sheet 41.

Figure 13:
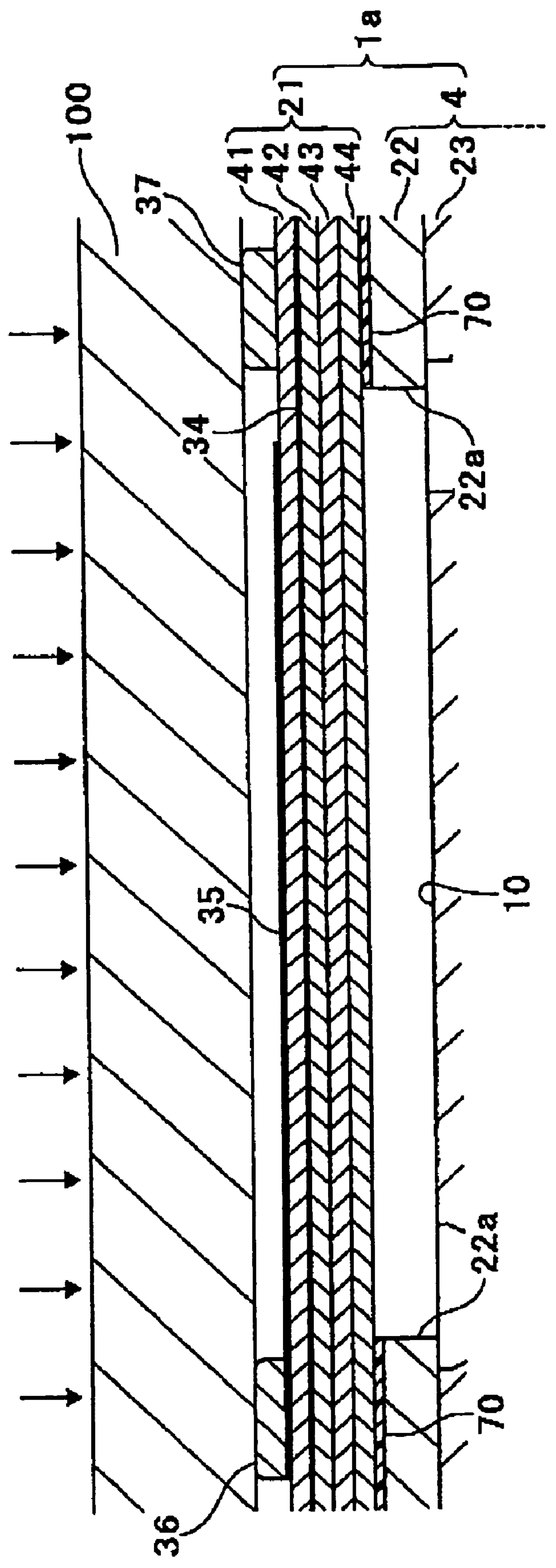
FIG. 13 is a sectional view showing a step of adhering the actuator unit to a passage unit.

Then, the passage unit 4 and the actuator unit 21 formed through the aforementioned steps are adhered to each other. In this adhering step, a thermosetting adhesive layer 70 (see FIG. 13) is formed on the wall portions 22*a* of the cavity plate 22 of the passage unit 4 using an appropriate method such as transferring. The actuator unit 21 is then positioned and arranged on the passage unit 4, and a ceramic heater 100 as a pressurizing member is disposed on the actuator unit 21 to apply pressure and heat. Consequently, the passage unit 4 and the actuator unit 21 are fixed to each other, and the head main body 1*a* is prepared. At this time, the heater 100 is in contact only with the lands 36 and the dummy lands 37 without any contact with the piezoelectric sheets 41 to 44 and the individual electrodes 35.

Then, the terminals 54 of the FPC 50 are connected to the lands 36 in order to feed electric signals to the individual electrodes 35, and manufacture of the ink-jet head 1 is completed through further predetermined steps.

Figure 14A:
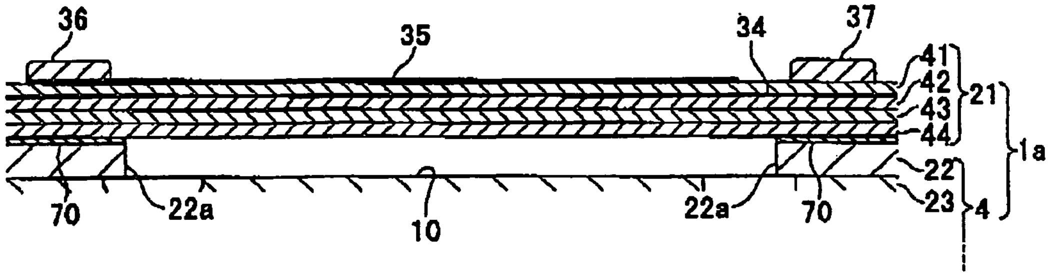
FIGS. 14A, 14B, and 14C are sectional views stepwisely showing an exemplary step of connecting the terminal of the flexible printed circuit to the land.
Figure 14B:
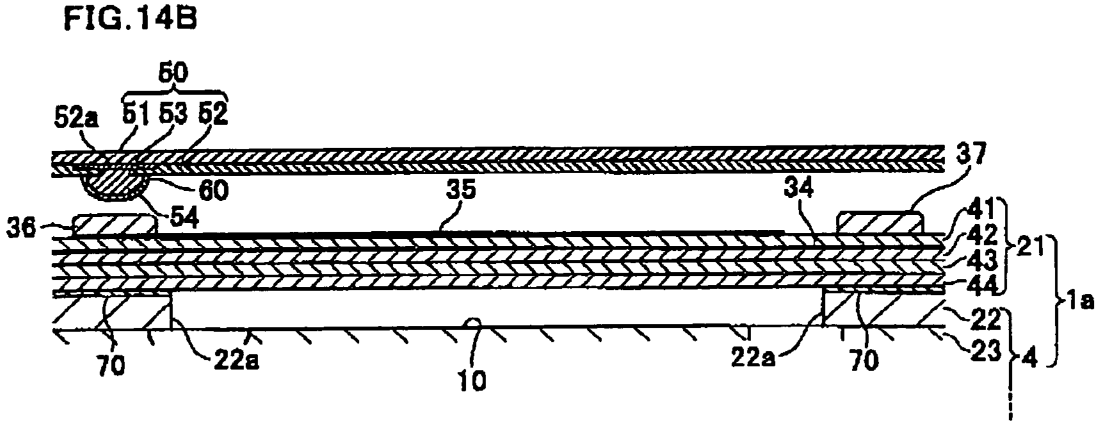
Figure 14C:
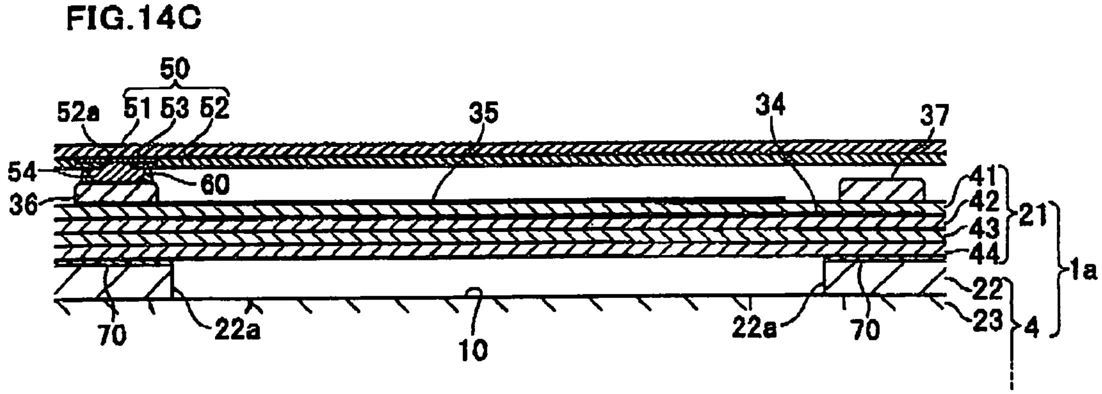

Here, an exemplary step of connecting the terminals 54 of the FPC 50 to the lands 36 will be described with reference to FIGS. 14A, 14B, and 14C. FIGS. 14A, 14B, and 14C stepwisely show the step of connecting the terminal 54 to the land 36.

FIG. 14A shows the head main body 1*a* formed by adhering the actuator unit 21 to the passage unit 4 as described above. First, the solder 60 having a thickness of approximately 10 μm is put to cover an entire surface of the terminal 54 of the FPC 50 (see FIG. 14B). The FPC 50 is then positioned such that the terminal 54 may confront the land 36, and, in this condition, the FPC 50 is brought closer to the actuator unit 21 to eventually reach a contact between the terminal 54 and the land 36 (see FIG. 14C). When, e.g., a ceramic heater (not illustrated) is disposed on an upper face of the base film 51 of the FPC 50 and pressure and heat are applied, the solder 60 melts into such a shape as to cover an entire circumference of the terminal 54, i.e., from the lower face of the cover film 52 to a surface of the land 36, to thus provide a complete connection of the terminal 54 and the land 36. Subsequent curing of the solder 60 completes the connection of the terminal 54 and the land 36, and as such the FPC 50 is electrically connected to the individual electrode 35.

Although the FPC 50 and the dummy land 37 are out of contact with each other in FIG. 14C, they may be brought into contact when the FPC 50 is bent or distorted. In any case, however, the FPC 50 never contacts with the piezoelectric sheets 41 to 44 and the individual electrodes 35, with a space ensured between the FPC 50 and the piezoelectric sheet 41.

As described above, the ink-jet head 1 of this embodiment has a structure in which the actuator unit 21 including the piezoelectric sheets 41 to 44 is arranged on the passage unit 4 including the pressure chambers 10, wherein on the piezoelectric sheets 41, formed are not only the individual electrodes 35 corresponding to the respective pressure chambers 10 but also the lands 36 and the dummy lands 37 corresponding to the respective individual electrodes 35. The lands 36 are connected to the respective individual electrodes 35, and the dummy lands 37 are spaced from the respective individual electrodes 35. Both of the lands 36 and the dummy lands 37 have substantially the same height from the surface of the piezoelectric sheet 41, which is higher than that of the individual electrodes 35. Like this, since two protrusions in total, i.e., a land 36 and a dummy land 37 are provided for one individual electrode 35, pressure applied by the heater 100 can be dispersed when the actuator unit 21 is adhered to the passage unit 4. More specifically, the heater 100 becomes in contact only with the lands 36 and the dummy lands 37, and its pressure is dispersed relatively well, through the lands 36 and the dummy lands 37, over planes of the piezoelectric sheets 41 to 44 and the passage unit 4. This makes uniform a thickness of the adhesive layer 70 formed between the passage unit 4 and the piezoelectric sheet 44, and accordingly prevents a variation in ink ejection characteristics.

In addition, the lands 36 are shaped into protrusions and their height from the surface of the piezoelectric sheet 41 is higher than that of the individual electrodes 35. Consequently, when the FPC 50 is disposed on the piezoelectric sheet 41, a relatively large space can be ensured between the FPC 50 and the piezoelectric sheet 41. Further, the space can more surely be ensured by providing the dummy lands 37 in addition to the lands 36. This allows a stable connection of the lands 36 and the FPC 50, thereby suppressing overflow of the solder 60 and thus preventing a short circuit between the neighboring individual electrodes 35. That is, the individual electrodes 35 can be connected to the FPC 50 with high reliability.

From the viewpoint of effects of the manufacturing method of this embodiment, in the step of adhering the actuator unit 21 to the passage unit 4, the lands 36 serving basically as contacts with the FPC 50 are utilized and further the dummy lands 37 are also utilized for dispersing the pressure applied by the heater 100. Thus, the ink-jet head 1 having the above-described effects can efficiently be manufactured.

Further, also in the step of connecting the terminals 54 of the FPC 50 to the lands 36, the lands 36 and the dummy lands 37 are utilized for ensuring a space between the FPC 50 and the piezoelectric sheet 41. Thereby, the connecting can be performed in a stable manner.

Further, one mentionable effect obtained by surely ensuring the space between the FPC 50 and the piezoelectric sheet 41 is that external force can be prevented from acting on the individual electrodes 35. That is, even when the FPC 50 is bent or distorted, the FPC 50 is never in contact with the individual electrodes 35, because each individual electrode 35 is surrounded with the lands 36 and the dummy lands 37 so that a space is surely ensured particularly around each individual electrode 35. Deformation of the individual electrodes 35 caused by external force may deteriorate deformability of the actuator unit 21, but such a problem can be prevented in this embodiment.

If the lands 36 and the dummy lands 37 are arranged to oppose the pressure chambers 10 instead of the wall portions 22*a*; when the lands 36 and the dummy lands 37 receive force during, e.g., pressure application by the heater 100, the piezoelectric sheets 41 to 44 tend to be damaged due to cavities of the pressure chambers 10 located thereunder. In this embodiment, on the other hand, the foregoing problem of damage to the piezoelectric sheets 41 to 44 can be relieved, because both the lands 36 and the dummy lands 37 are arranged at positions opposing the wall portions 22*a* as illustrated in FIG. 9.

One mentionable effect obtained by arranging the lands 36 to oppose the wall portions 22*a* and by suppressing the overflow of the solder 60 as mentioned above is that the solder 60 can be prevented from flowing into regions opposing the pressure chambers 10. When the solder 60 flows into the regions opposing the pressure chambers 10, deformability of the actuator unit 21 may deteriorate. However, such a problem can be prevented in this embodiment.

In this embodiment, further, each of the individual electrodes 35 is provided with a corresponding one of the lands 36 and a corresponding one of the dummy lands 37 that make a pair and are positioned symmetrically with respect to a center of a corresponding one of the pressure chambers 10, as illustrated in FIG. 10. Therefore, pressure applied by the heater 100 can effectively be dispersed particularly around the pressure chamber 10, to thereby more surely uniformalize the thickness of the adhesive layer 70 around the pressure chamber 10.

As illustrated in FIGS. 11A and 11B, the pressure chambers 10 are formed adjacently to each other on the surface of the passage unit 4, and each of the individual electrodes 35 is surrounded with the corresponding land 36 and the corresponding dummy land 37 in a pair, and is also surrounded with lands 36 and dummy lands 37 corresponding to other individual electrodes 35 adjacent to the individual electrode 35. In this case, not only the land 36 and the dummy land 37 corresponding to the individual electrode 35 but also lands 36 and dummy lands 37 corresponding to other adjacent individual electrodes 35 contribute to force transmission to the adhesive layer 70 around a corresponding one of the pressure chambers 10. As a result, since pressure applied by the heater 100 is more efficiently dispersed particularly around the pressure chambers 10, the thickness of the adhesive layer 70 can reliably be made uniform.

Like this, since the individual electrode 35 is surrounded not only with the corresponding land 36 and dummy land 37 but also with lands 36 and dummy lands 37 corresponding to other individual electrodes 35, the space between the FPC 50 and the piezoelectric sheet 41 can more surely be ensured particularly around the pressure chambers 10, so that a solder joint can more stably be performed to advantageously prevent a short circuit.

Moreover, the lands 36 and the dummy lands 37 are, as illustrated in FIG. 11B, arranged around each individual electrode 35 in a symmetrical manner with respect to the center of a corresponding pressure chamber 10. More specifically, the pressure chambers 10 each having a rhombic shape are formed on the surface of the passage unit 4, and three lands 36 and three dummy lands 37 are arranged in a hexagonal formation around each individual electrode 35 corresponding to each pressure chamber 10. In this case, pressure applied by the heater 100 is transmitted to the piezoelectric sheets 41 to 44 and the adhesive layer 70 via six lands 36 and dummy lands 37 positioned at vertexes of the hexagon. As a result, the pressure is dispersed more efficiently and more uniformly, particularly around the pressure chambers 10. Therefore, the thickness of the adhesive layer 70 can more reliably be made uniform.

The plurality of pressure chambers 10 are formed in a matrix on the surface of the passage unit 4, which contributes to an excellent densification of the pressure chambers 10, i.e., high resolution. When the pressure chambers 10 are densely arranged in the passage unit, a problem of short circuit between neighboring individual electrodes 35 becomes prominent. In this embodiment, however, densification of the pressure chambers 10 results in a cyclic arrangement pattern of the lands 36 and the dummy lands 37, so that the space is more surely ensured between the FPC 50 and the piezoelectric sheet 41 and therefore the solder joint can be performed in a more stable manner. That is, a short circuit can be prevented effectively even when the pressure chambers 10 are arranged at a high density. Moreover, the cyclic arrangement pattern of the lands 36 and the dummy lands 37 makes uniform the thickness of the adhesive layer 70.

The pressurizing member used in the step of adhering the actuator unit 21 to the passage unit 4 is not limited to the heater 100. The actuator unit 21 may be adhered to the passage unit 4 without the application of heat, for example. In such a case, the adhesive layer 70 need not have a thermosetting property.

Figure 15:
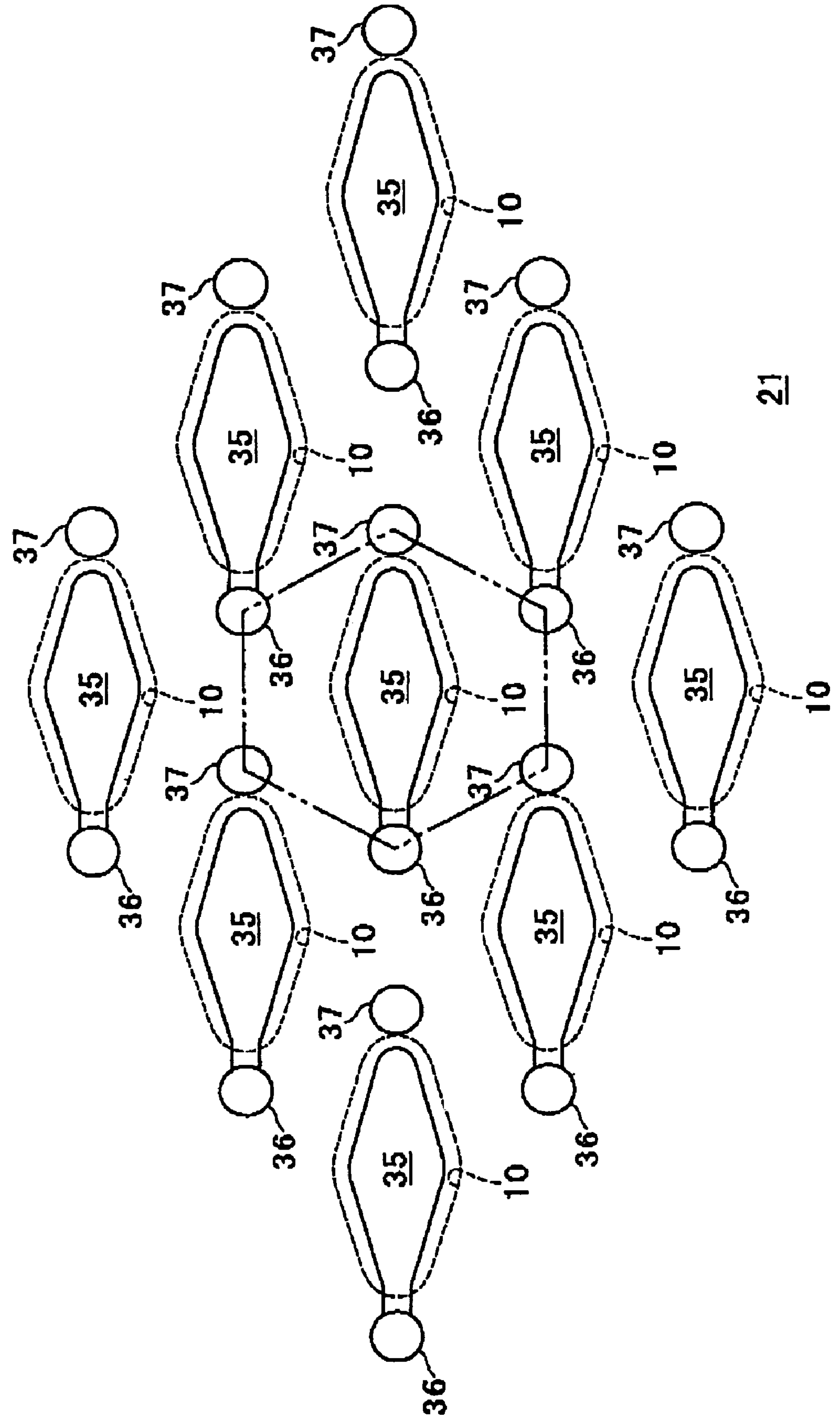
FIG. 15 is a partial plan view of a modification of the individual electrodes, the lands, and the dummy lands arranged on the surface of the actuator unit.

FIG. 15 shows a possible modification of how to arrange the pressure chambers 10, the individual electrodes 35, the lands 36, and the dummy lands 37. This modification differs from the aforementioned embodiment in shape and arrangement direction of the pressure chambers 10 and the individual electrodes 35 (see FIGS. 5 and 11A). As for the shape, the pressure chambers 10 and the individual electrodes 35 in the aforementioned embodiment are longer and thinner than in this modification. As for the arrangement, the pressure chambers 10 in the aforementioned embodiment are not arranged along both longer and shorter diagonals of a rhomboid forming the pressure chamber 10, while the pressure chambers 10 in this modification are arranged along these two diagonals. In the aforementioned embodiment, in particular, the pressure chambers 10 are not arranged along the shorter diagonal of the rhomboid forming the pressure chamber 10. Due to such a difference in arrangement of the pressure chambers 10, etc., six lands 36 and dummy lands 37 arranged around each individual electrode 35 are in a regular-hexagonal formation in this modification while they are not in such a formation in the aforementioned embodiment. Such a balanced formation of the lands 36 and the dummy lands 37 arranged around each individual electrode 35 makes more uniform the thickness of the adhesive layer 70. Thus, the modification shown in FIG. 15 is more preferable to realize the uniform thickness of the adhesive layer 70.

However, the formation of the lands 36 and the dummy lands 37 arranged around each individual electrode 35 is not limited to hexagons. In addition, the lands 36 and the dummy lands 37 arranged around each individual electrode 35 may not necessarily be positioned symmetrically with respect to a center of a corresponding pressure chamber 10.

Further, it is not always necessary that each individual electrode 35 is surrounded with lands 36 and dummy lands 37 corresponding to other individual electrodes 35 adjacent to the individual electrode 35. That is, each individual electrode 35 can be surrounded only with a land 36 and a dummy land 37 corresponding to that individual electrode 35. Alternatively, arbitrarily-formed dummy lands can be arranged, as described later.

In the aforementioned embodiment, a single land 36 is provided for one individual electrode 35. However, this is not limitative, and a plurality of lands 36 can be provided for one individual electrode 35. In such a case, however, there is involved increased number of connection of the land 36 and the terminal 54, and at the same time an electrical connection system becomes complicated.

In the aforementioned embodiment, the lands 36 are formed on surfaces of the individual electrodes 35, and more specifically on surfaces of the connecting portions 35*y*. However, a location of the lands 36 is not limited thereto as long as the height of the lands 36 from the surface of the piezoelectric sheet 41 is higher than that of the individual electrodes 35. For example, the lands 36 can be formed on the surface of the piezoelectric sheet 41.

Similarly, although a single dummy land 37 is provided for one individual electrode 35 to make a pair with the land 36, this is not limitative. For example, two or more dummy lands 37 can be provided for one individual electrode 35. In addition, the dummy lands 37 can be formed at any arbitrary positions on the surface of the piezoelectric sheet 41 except positions where the individual electrodes 35 and the dummy lands 36 are formed.

Shapes of the lands 36 and the dummy lands 37 can also be variously changed.

Although, in the aforementioned embodiment, both the lands 36 and the dummy lands 37 are made of gold including glass frits, this is not limitative. However, it is preferable to form the lands and the dummy lands from the same material, because they can be formed at one time and the manufacturing process can thereby be simplified.

Moreover, it is not always necessary to use the solder 60 to connect the terminals 54 to the lands 36. For example, metallic binders made of tin, ACP (Anisotropic Conductive Paste) of thermosetting resins, and any other materials may be used for the connection.

Although, in the aforementioned embodiment, the dummy lands 37 are not connected to the FPC 50, the FPC 50 can be provided with terminals for the dummy lands 37 to connect these terminals to the dummy lands 37. In such a case, since the FPC 50 is not easily separated from the actuator 21, the FPC 50 and the actuator 21 can be bended to each other with increased reliability.

The actuator unit is, further, not limited to the one illustrated in the aforementioned embodiment. For example, a common electrode may be disposed between the piezoelectric sheets 43 and 44, or additional individual electrodes may be disposed between the piezoelectric sheets 42 and 43. The common electrode 34 of the aforementioned embodiment is a single conductive sheet spanning the entire surface of the piezoelectric sheet. However, a common electrode having a larger area than that of the pressure chamber 10 can be provided for each pressure chamber 10 so that a projective region of each common electrode in a thickness direction of the sheets may cover an area of each pressure chamber 10. Alternatively, a common electrode having a slightly smaller area than that of the pressure chamber 10 can be provided for each pressure chamber 10 so that a projective region of each common electrode in a thickness direction of the sheets may fall within an area of each pressure chamber 10. In such cases where each pressure chamber 10 is provided with its own common electrode, the common electrodes need be electrically connected to one another so that all the common electrodes may have the same potential in their portions corresponding to the respective pressure chambers 10.

A planar shape of the pressure chamber is not limited to a quadrilateral such as rhomboid but may variously be changed, e.g., into circles, ellipses, and the like. In addition, the arrangement of the pressure chambers 10 on the surface of the passage unit 4 is not limited to a matrix arrangement.

The ink-jet head according to the present invention can be used not only in a line-type ink-jet printer that performs printing by conveying a paper relative to a fixed head main body as in the aforementioned embodiment, but also in a serial-type ink-jet printer that performs printing by, for example, conveying a paper and at the same time reciprocating a head main body perpendicularly to a paper conveyance direction.

Further, an application of the ink-jet head according to the present invention is not limited to ink-jet printers, and it is also applicable to, for example, ink-jet type facsimiles or copying machines.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A method for manufacturing an ink-jet head comprising the steps of:

forming a passage unit that has a plurality of pressure chambers, a plurality of nozzles communicating with the respective pressure chambers, and a plurality of wall portions separating the pressure chambers from each other;

forming an actuator unit that changes the volume of the pressure chambers to thereby eject ink through the nozzles;

the step of forming the actuator unit including the steps of:

disposing, at a piezoelectric element, a plurality of surface electrodes and a common electrode, such that the piezoelectric element is sandwiched between the common electrode and the plurality of surface electrodes;

forming a plurality of first lands on a surface on which the surface electrodes are disposed, so that the first lands are connected to the respective surface electrodes, the first lands having a higher height from the surface on which the surface electrodes are disposed than that of the surface electrodes; and forming a plurality of second lands on the surface on which the surface electrodes are disposed, so that the second lands are electrically separated from the respective surface electrodes, the second lands having substantially the same height from the surface on which the surface electrodes are disposed as that of the first lands;

the method further comprising the steps of:

forming an adhesive layer on the wall portions of the passage unit; and positioning the actuator unit onto the passage unit such that the surface electrodes are arranged at positions corresponding to the respective pressure chambers and each of the first and second lands is arranged along a straight line which passes through corresponding one of the wall portions in a direction perpendicular to the surface on which the surface electrodes are disposed, and then disposing a pressurizing member on the surface of the actuator unit, on which the surface electrodes are disposed, to press and adhere the actuator unit to the passage unit.

2. The method for manufacturing an ink-jet head according to claim 1, further comprising the step of attaching a flexible flat cable on the actuator unit such that terminals of the flexible flat cable are connected to the respective first lands.

3. The method for manufacturing an ink-jet head according to claim 1, wherein: the first and second lands are separated in a horizontal direction; and the first and second lands are in vertical alignment with the wall portions.

4. The method for manufacturing an ink-jet head according to claim 1, wherein: the surface electrodes are separate structures from the first and second lands.

5. The method for manufacturing an ink-jet head according to claim 1, wherein, when the pressurizing member is disposed on the actuator unit, the pressurizing member contacts the first and second lands, and forms a gap between the pressurizing member and the surface electrodes.

* * * * *